United States Patent
Chang et al.

(10) Patent No.: US 11,127,583 B2
(45) Date of Patent: Sep. 21, 2021

(54) METHOD OF TREATING SEMICONDUCTOR SUBSTRATE

(71) Applicant: TAIWAN SEMICONDUCTOR MANUFACTURING CO., LTD., Hsinchu (TW)

(72) Inventors: Chung-Hao Chang, Hsinchu (TW); Chitong Chen, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 134 days.

(21) Appl. No.: 16/542,036

(22) Filed: Aug. 15, 2019

(65) Prior Publication Data

US 2020/0058487 A1    Feb. 20, 2020

Related U.S. Application Data

(60) Provisional application No. 62/719,394, filed on Aug. 17, 2018.

(51) Int. Cl.
*H01L 21/02* (2006.01)
*H01L 21/027* (2006.01)
*C23C 16/455* (2006.01)
*B05D 1/00* (2006.01)

(52) U.S. Cl.
CPC .......... *H01L 21/02016* (2013.01); *B05D 1/60* (2013.01); *C23C 16/45519* (2013.01); *H01L 21/0274* (2013.01); *H01L 21/02227* (2013.01)

(58) Field of Classification Search
None
See application file for complete search history.

(56) References Cited

U.S. PATENT DOCUMENTS

2018/0025899 A1* 1/2018 Kang ............... H01L 22/12
216/89

FOREIGN PATENT DOCUMENTS

TW    201320236 A    5/2013
TW    201816836 A    5/2018

* cited by examiner

*Primary Examiner* — Dung A. Le
(74) *Attorney, Agent, or Firm* — McDermott Will & Emery LLP

(57) ABSTRACT

A method of treating a semiconductor substrate includes converting a first main side of the semiconductor substrate having a first coefficient of static friction relative to a surface of a wafer table to a second coefficient of static friction relative to the surface of the wafer table, wherein the second coefficient of static friction is less than the first coefficient of static friction. A photoresist layer is applied over a second main side of the semiconductor substrate having the first coefficient of static friction. The second main side opposes the first main side. The semiconductor substrate is placed on the wafer table so that the first main side of the semiconductor substrate faces the wafer table.

20 Claims, 9 Drawing Sheets

METHOD OF TREATING SEMICONDUCTOR SUBSTRATE

CROSS-REFERENCE TO RELATED APPLICATIONS

This application claims priority to U.S. Provisional Patent Application No. 62/719,394, filed Aug. 17, 2018, the entire disclosure of which is incorporated herein by reference.

BACKGROUND

Friction between a semiconductor substrate or wafer and a wafer table can damage the wafer table, necessitating the replacement of the wafer table at two to three month intervals. The application of a low coefficient of static friction materials to the semiconductor substrate to reduce the friction of the semiconductor substrate can produce deleterious side effects including critical dimension variation. In addition, the low coefficient of static friction materials can serve as a scum defect source. Improved wafer table flatness and improvement in wafer clamping without the deleterious side effects disclosed herein is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Friction between semiconductor substrates or wafers and wafer tables can scratch the wafer table leading to unevenness and issues with clamping the semiconductor substrate or wafer to the wafer table. As used herein, wafer table refers to either a wafer table of a scanner or a stepper used in a photolithographic scanner exposure tool or a photolithographic stepper tool, respectively. To address table flatness and wafer clamping issues, including scratching the table surface, converting a surface of the semiconductor substrate contacting a wafer table from a higher coefficient of static friction to a lower coefficient relative to the surface of the wafer table is performed.

Figure 1:
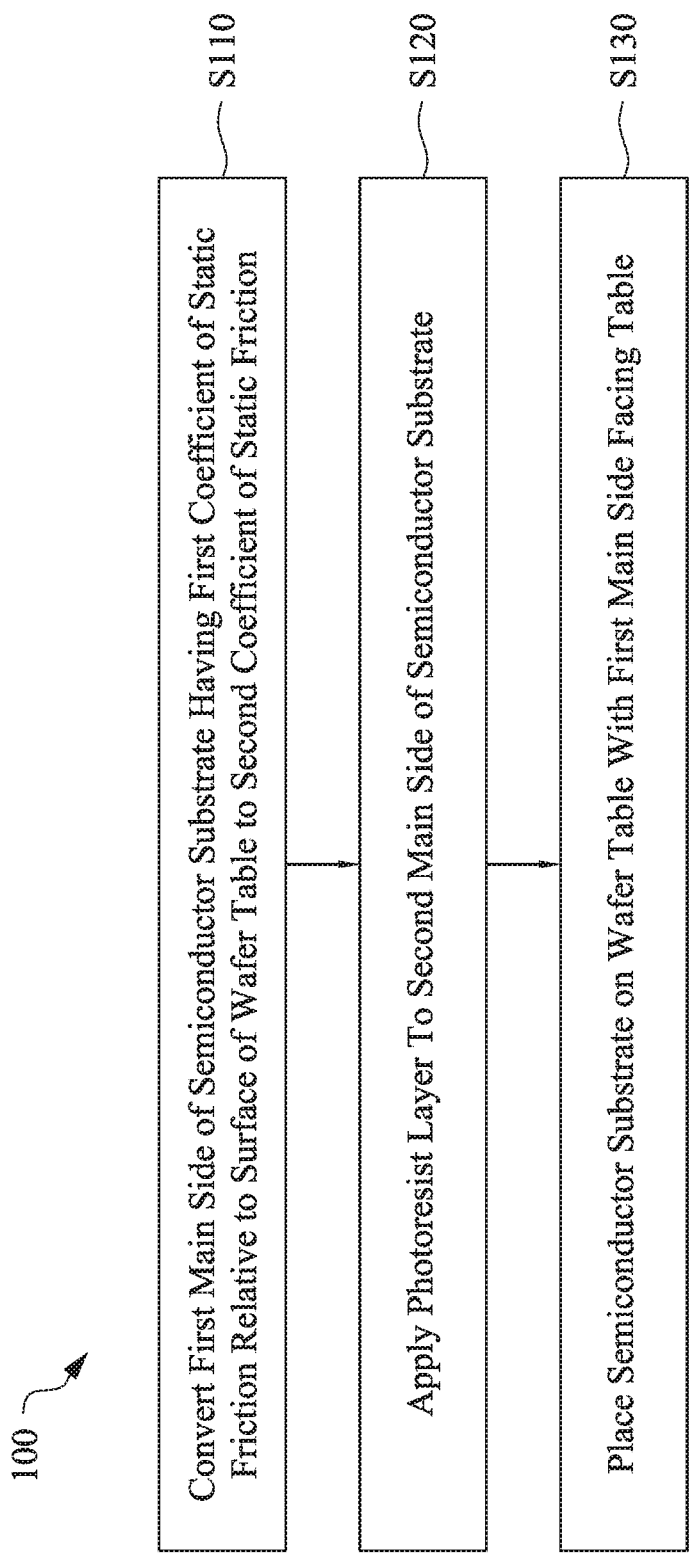
FIG. 1 is a flowchart illustrating a method of treating a semiconductor substrate according to embodiments of the present disclosure.

As shown in FIG. 1, an embodiment of the present disclosure is a method 100 of treating a semiconductor substrate. The method includes an operation S110 of converting a first main side of the semiconductor substrate having a first coefficient of static friction relative to a wafer table to a second coefficient of static friction relative to the surface of the wafer table. The second coefficient of static friction is less than the first coefficient of static friction. In some embodiments, the coefficient of static friction of the semiconductor substrate is changed by converting hydroxyl groups on the surface of the semiconductor substrate to organic groups, such as alkyl groups. Then a photoresist layer is applied over a second main side of the semiconductor substrate in operation S120. The second main side opposes the first main side. In operation S130, the semiconductor substrate is placed on the wafer table so that the first main side of the semiconductor substrate faces the wafer table.

Figure 2A:
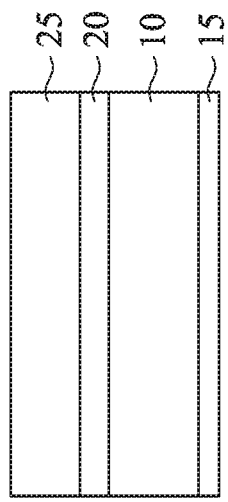
FIGS. 2A, 2B, 2C, 2D, and 2E sequentially illustrate a method according to embodiments of the present disclosure.

FIGS. 2A, 2B, 2C, 2D, and 2E are cross-sectional views sequentially illustrating a method according to embodiments of the embodiments of the present disclosure. As shown in FIG. 2A, a bottom surface 10a of a semiconductor substrate 10 having a higher coefficient of static friction relative to a wafer table is converted to a surface having a lower coefficient of static friction relative to the surface of the wafer table by applying a layer 15 of friction-reducing material to the bottom surface 10a of the semiconductor substrate 10 in some embodiments. In some embodiments a bottom anti-reflection coating (BARC) is applied to an upper surface 10b of the semiconductor substrate 10 thereby forming a BARC layer 20.

In some embodiments, the semiconductor substrate 10 includes a single crystalline semiconductor layer on at least its surface. The semiconductor substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the semiconductor substrate 10 is made of Si. In some embodiments, the semiconductor substrate is a silicon wafer. In some embodiments, the semiconductor substrate includes a backside layer formed of a metal nitride, such as titanium nitride.

In some embodiments, the BARC layer 20 is made of an organic material. In some embodiments, the BARC layer 20 is made of a thermally cross-linking organic polymeric material. In some embodiments, the thickness of the BARC layer 20 ranges from about 20 nm to about 100 nm. In some embodiments, the thickness of the BARC layer ranges from about 40 nm to about 80 nm.

In some embodiments, the friction-reducing material includes an alkylating material. In some embodiments, the friction-reducing material is hexamethyldisilazane (HMDS). In some embodiments, the semiconductor substrate includes silicon and the friction-reducing material is HMDS. A bottom surface 10a of the silicon-containing substrate 10 is coated with a layer 15 of the friction-reducing material. In some embodiments, the layer 15 of the friction-reducing material has a thickness ranging from about 0.3 nm to about 3 nm. In some embodiments, the friction-reducing material, such as HMDS, reacts with Si—OH groups on the surface of the semiconductor substrate 10 to convert Si—OH to Si—OCH$_3$. Thus, in some embodiments, a first main side (bottom side) 10a of the semiconductor substrate is alkylated. In some embodiments, where the semiconductor substrate has a metal nitride backside layer, such as a TiN layer, the friction reducing material is an alkali material, such as tetramethyl ammonium hydroxide (TMAH). The alkali material changes the metal nitride surface roughness, thereby changing the adhesion to the metal nitride surface. After the friction-reducing material reacts with the semiconductor substrate, the coefficient of static friction of the side of the semiconductor substrate that was coated with the friction-reducing material is less than an opposing side of the semiconductor substrate that was not coated with the friction-reducing material.

Figure 2B:
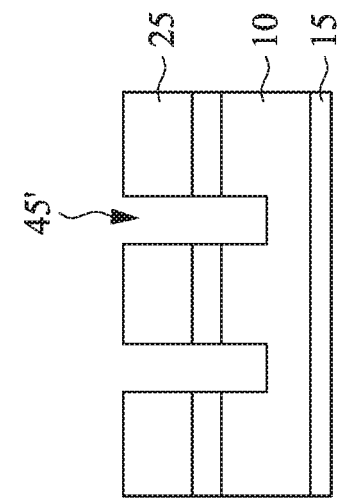

A photoresist layer 25 is disposed over a second main side 10b of the semiconductor substrate 10 opposing the first main side 10a. In some embodiments, the photoresist layer 25 is formed over the BARC layer 20, as shown in FIG. 2B. In some embodiments, no friction-reducing material is applied to the first main side 10a of the semiconductor substrate before coating the photoresist layer 25 on the BARC layer.

In some embodiments, the photoresist layer 25 is a positive tone photoresist, in other embodiments the photoresist layer 25 is a negative tone photoresist. A positive tone resist refers to a photoresist material that when exposed to radiation (typically UV light) becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of the negative tone resist that becomes insoluble upon exposure to radiation may become insoluble due to a cross-linking reaction caused by the exposure to radiation.

Whether a resist is a positive or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

Photoresists according to the present disclosure include a polymer resin along with one or more photoactive compounds (PACs) in a solvent, in some embodiments. In some embodiments, the polymer resin includes a hydrocarbon structure (such as an alicyclic hydrocarbon structure) that contains one or more groups that will decompose (e.g., acid labile groups or acid leaving groups) or otherwise react when mixed with acids, bases, or free radicals generated by the PACs, such as a photoacid generator. In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

Figure 2C:
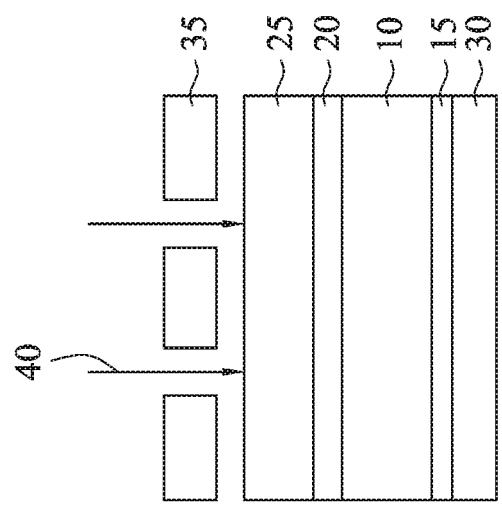

As shown in FIG. 2C, the photoresist-coated semiconductor substrate is subsequently placed on a wafer table 30 and the photoresist is selectively exposed to actinic radiation 40. The photoresist layer 25 is exposed to a laser radiation, such as by a laser scanning tool in some embodiments. In other embodiments, the photoresist layer 25 is selectively exposed to actinic radiation by placing a photomask 35 between the photoresist layer 25 and the actinic radiation source in a stepper tool. In some embodiments, the actinic radiation is ultraviolet radiation, deep ultraviolet radiation, extreme ultraviolet radiation, electron beam, or ion beam. In some embodiments, the deep ultraviolet radiation source is a 193 nm or 248 nm wavelength excimer laser.

Figure 2D:
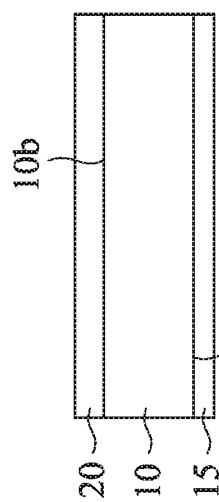
Figure 2E:
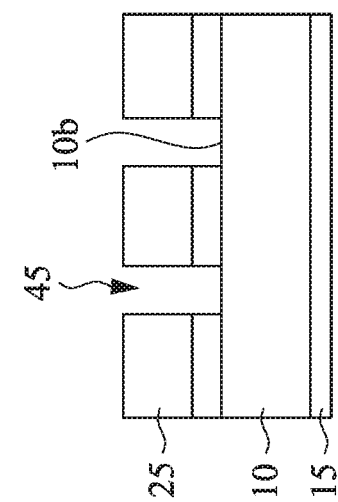

The selectively exposed photoresist layer is subsequently developed using a suitable developer to form a pattern 45 in the photoresist layer 25 and BARC layer 20, thereby exposing the upper main side 10b of the semiconductor substrate, as shown in FIG. 2D. In the illustrated embodiment, the photoresist layer 25 is a positive tone photoresist and the portion of the photoresist layer 25 exposed to the actinic radiation 40 is removed during the development operation. In some embodiments, only the photoresist layer 25 is developed with a developer, such as TMAH, and the exposed BARC layer 20 is removed by dry etching (dry developing). The exposed portions of the semiconductor substrate are subsequently etched, as shown in FIG. 2E, to form a pattern 45' in the semiconductor substrate. It is understood that the semiconductor devices formed according to the disclosed methods undergo further processes, including material deposition, implantation, or etching operations, to form various features such as field effect transistors, cap insulating layers, contacts/vias, silicide layers, interconnect metal layers, dielectric layers, passivation layers, metallization layers with signal lines, etc. In some embodiments, one or more layers of conductive, semiconductive, and insulating materials are formed over the substrate, and a pattern is formed in one or more of the layers.

Figure 3:
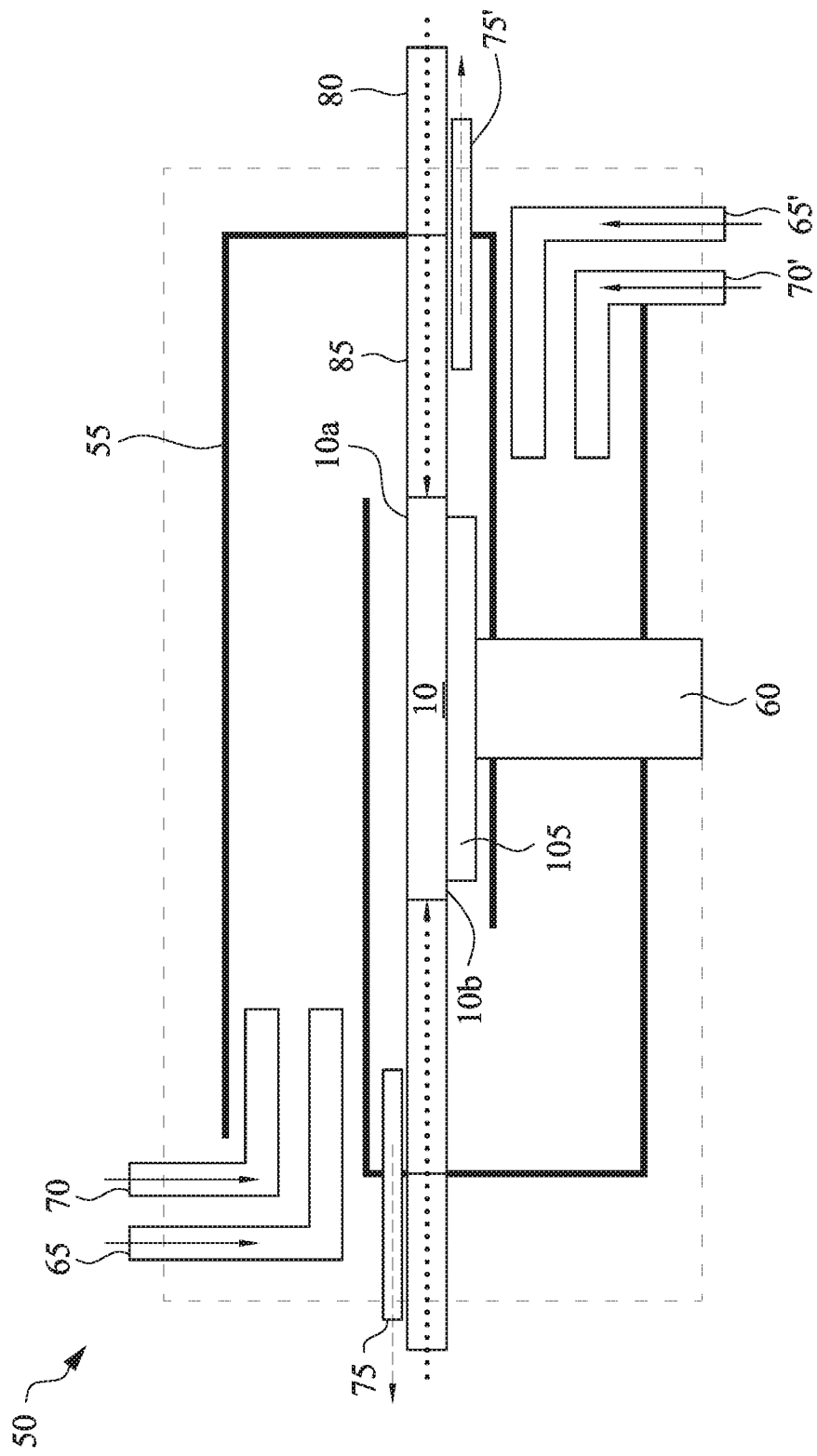
FIG. 3 is a schematic illustration of a deposition chamber according to an embodiment of the present disclosure.

FIG. 3 is a schematic illustration of a deposition chamber according to an embodiment of the present disclosure. In some embodiments, the friction-reducing layer is formed over the semiconductor substrate in a deposition chamber configured to allow only one main side of the semiconductor substrate to be coated with the friction-reducing layer. In some embodiments, gas walls 85 are used in the deposition chamber 50 to isolate the friction-reducing material to a specific region of the deposition chamber, as shown in FIG. 3. In some embodiments, the deposition chamber is a vacuum chamber. In some embodiments, the semiconductor substrate 10 is introduced into the chamber and is supported on a wafer support 60. In some embodiments, a vacuum is applied to the deposition chamber, and then a gas wall 85 is formed extending from a chamber wall 55 to the semiconductor substrate along a length or radial direction of the semiconductor substrate 10. The gas wall 85 is provided by introducing gas through one or more gas wall gas inlets 80 positioned along a periphery of the chamber wall 55. In some embodiments, the gas wall 85 seals the chamber 50 from the chamber walls 55 to the sides of the semiconductor substrate 10 being processed such that friction-reducing material does not pass across the gas wall 85. In some embodiments, the gas wall 85 includes air or an inert gas. The inert gas includes nitrogen, helium, neon, argon, and/or xenon. In some embodiments, the gas pressure in the gas wall is about 0.25 mbar+/−10%. In some embodiments, the gas wall gas flow is in a direction towards the edge of the semiconductor substrate 10, i.e.—the horizontal direction, as shown in FIG. 3.

In some embodiments, the friction-reducing material is introduced into the chamber at the coating material inlet 65, and the friction-reducing material is deposited on semiconductor substrate 10. Excess friction-reducing material is removed from the chamber at an exhaust 75. In some embodiments, the chamber 50 is flushed with an inert gas introduced through a carrier gas inlet 70 prior to or after the friction-reducing material is applied to the semiconductor substrate 10. The inert gas includes nitrogen, helium, neon, argon, and/or xenon.

In some embodiments, the chamber 50, including the chamber walls 55 and the gas walls 85, are configured so that the friction-reducing material applied to a first main side 10a of the semiconductor substrate is prevented from being applied to the opposing second main side 10b of the semiconductor substrate. In some embodiments, the chamber 50 is configured to allow the first main side 10a and the opposing second main side 10b of the semiconductor substrate to be independently coated with the friction-reducing material, or to allow both sides to be coated with different materials. In some embodiments, a passage is provided between the coating material inlet 65 to the substrate support 60. The passage provides a path for the friction-reducing material to flow from the coating material inlet 65 to a semiconductor substrate 10 mounted on the substrate support 60. As shown in FIG. 3, the portion of the chamber that the second main side 10b of the semiconductor substrate is exposed to includes a separate second coating material inlet 65', second carrier gas inlet 70', and second exhaust 75'. In some embodiments, the second coating material inlet 65' is located on an opposing side of the gas wall 85 from the first coating material inlet 65. The portion of the chamber 50 that the first main side 10a of the semiconductor substrate is exposed to is isolated from the portion of the chamber 50 that the second main side 10b of the semiconductor substrate is exposed to by a combination of the chamber wall 55 and gas wall 85 configuration. Thus, in some embodiments, different ambients are maintained in the different portions of the chamber. In some embodiments, the wafer support is a three-pin support 60' (see FIG. 4A). The three-pin support 60' allows the second main side 10b of the semiconductor substrate to be more uniformly coated with the friction-reducing material in some embodiments because more of the second main side 10b is exposed to the friction-reducing material than with other substrate supports.

In some embodiments, the chamber 50 includes a heater. The heater may be a localized heater, such as a hot plate 105, on which the semiconductor substrate is placed or a heater that heats the chamber walls 55, thereby heating the different portions of the chamber or the entire chamber. In some embodiments, instead of gas walls, one or more separation plates are disposed to separate gas flow between the upper and bottom surfaces of the semiconductor substrate 10.

Figure 4A:
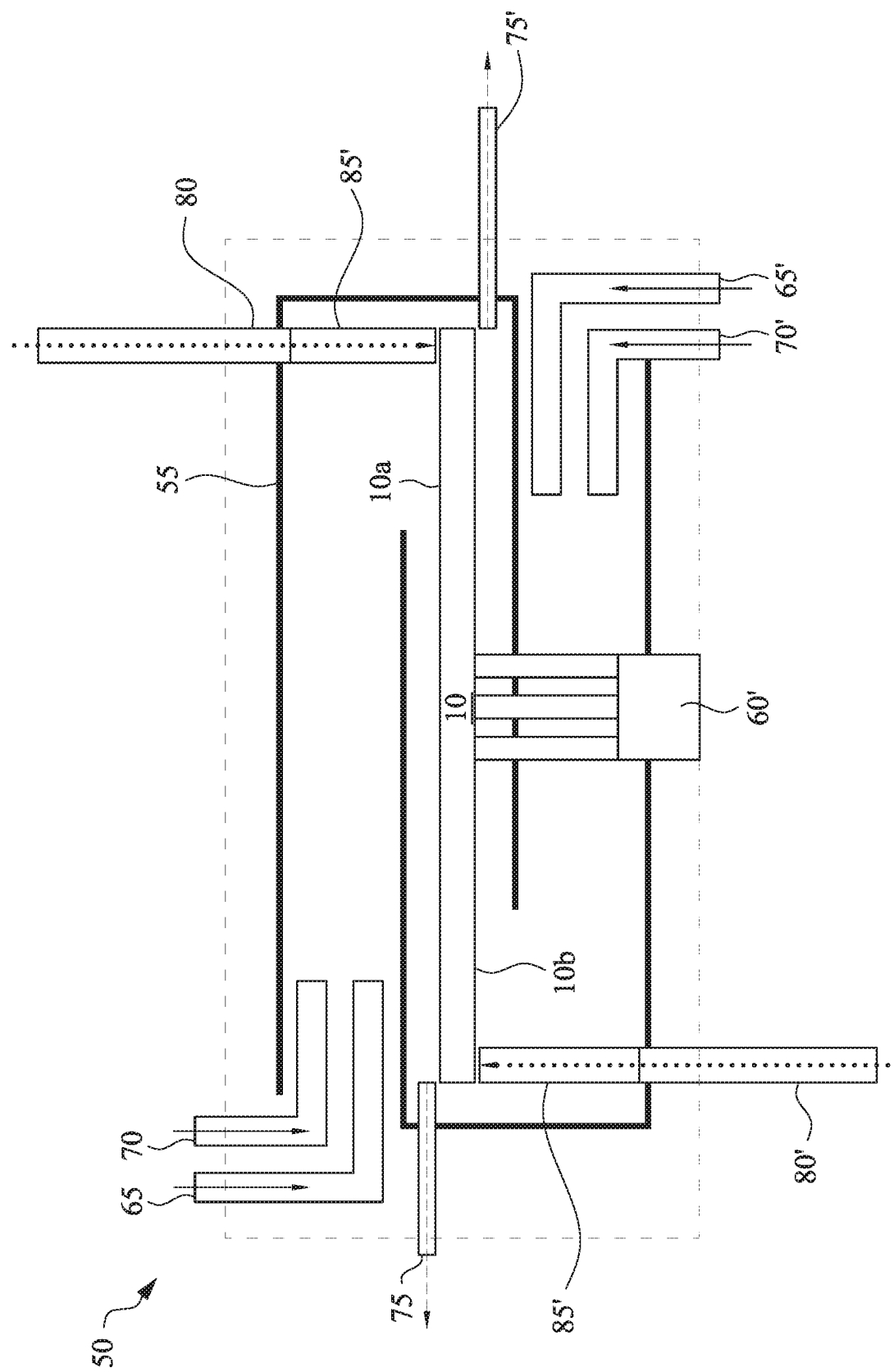
FIG. 4A is a schematic illustration of a deposition chamber according to an embodiment of the present disclosure.

FIG. 4A is a schematic illustration of a deposition chamber according to an embodiment of the present disclosure. In some embodiments, the gas walls 85' are used in the deposition chamber 50 to isolate the friction-reducing material to a specific region of the deposition chamber, as shown in FIG. 4A. In some embodiments, the gas wall gas flow is in a direction substantially perpendicular to the edge of semiconductor substrate 10, i.e.—the vertical direction, as shown in FIG. 4A.

In some embodiments, a vacuum is applied to the deposition chamber, and then a gas wall 85' is formed extending from a chamber wall 55 to an end portion of the semiconductor substrate 10. The gas wall 85' is provided by introducing gas through one or more gas wall gas inlets 80, 80' positioned along a periphery of the chamber wall 55. In some embodiments, the gas wall 85' seals the chamber from chamber walls 50 to sides of a semiconductor substrate 10 being processed such that friction-reducing material does not pass across the gas wall 85. In some embodiments, the gas wall 85 includes air or an inert gas. The inert gas includes nitrogen, helium, neon, argon, and/or xenon. In some embodiments, the gas pressure in the gas wall is about 0.25 mbar+/−10%. In some embodiments, the gas wall inlets 80, 80' are annular-shaped to provide a gas wall around the circumference of a semiconductor wafer substrate. In some embodiments, when the friction reducing material is applied to the upper surface 10a of the semiconductor substrate the gas wall 85' is applied to the lower surface 10b of the semiconductor substrate and not the upper surface. In other embodiments, when the friction reducing material is applied to the lower surface 10b of the semiconductor substrate the gas wall 85' is applied to the upper surface 10a of the semiconductor substrate and not the lower surface.

In some embodiments, the friction-reducing material is introduced into the chamber at the coating material inlet 65, and the friction-reducing material is deposited on the semiconductor substrate 10. Excess friction-reducing material is removed from the chamber at an exhaust 75. In some embodiments, the chamber 55 is flushed with an inert gas introduced through a carrier gas inlet 70 prior to or after the friction-reducing material is applied to the semiconductor substrate 10. The inert gas includes nitrogen, helium, neon, argon, and/or xenon.

In some embodiments, the wafer support is a three-pin support 60' to allow the second main side 10*b* of the semiconductor substrate to be more uniformly coated with the friction-reducing material in some embodiments because more of the second main side 10*b* is exposed to the friction-reducing material than with other substrate supports.

Figure 4B:
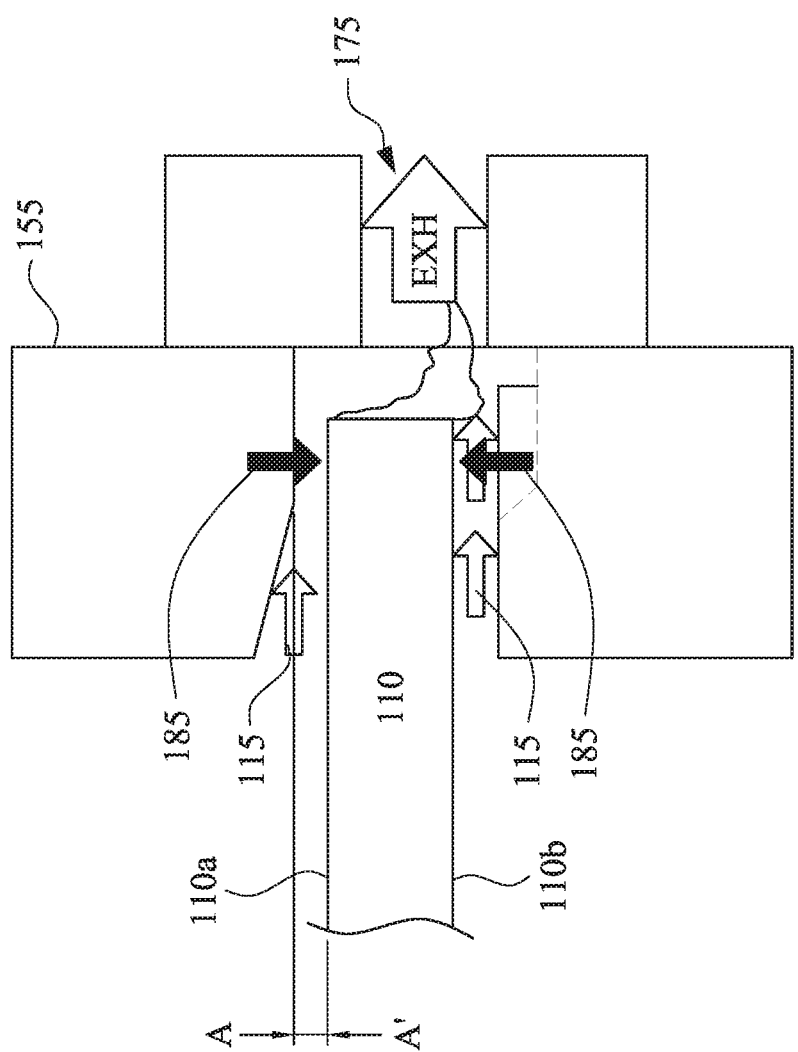
FIG. 4B is a schematic illustration of a deposition chamber according to an embodiment of the present disclosure.

FIG. 4B is a schematic illustration of a deposition chamber according to an embodiment of the present disclosure. A detailed view of a portion of the deposition chamber at the edge of a semiconductor substrate 110 and the chamber walls 155 is illustrated in FIG. 4B. The vertical arrows 185 illustrate the direction of the gas flow forming the gas walls. The smaller horizontal arrows 115 illustrate the direction of flow of the friction reducing material. Excess friction reducing material 115 is exhausted from the chamber 155 through the exhaust outlet 175 in some embodiments. In some embodiments, when the friction reducing material 115 is applied to the upper surface 110*a* of the semiconductor substrate the gas wall 185 is applied to the lower surface 110*b* of the semiconductor substrate and not the upper surface. In other embodiments, when the friction reducing material is applied to the lower surface 110*b* of the semiconductor substrate the gas wall 185 is applied to the upper surface 110*a* of the semiconductor substrate and not the lower surface. In some embodiments, a portion of the chamber walls 155 overhang the edges of the semiconductor substrate 110, and there is a gap A-A' of about 0.25 to 0.30 mm between the semiconductor substrate 110 upper or lower surface 110*a*, 110*b* and the chamber walls 155.

Figure 5:
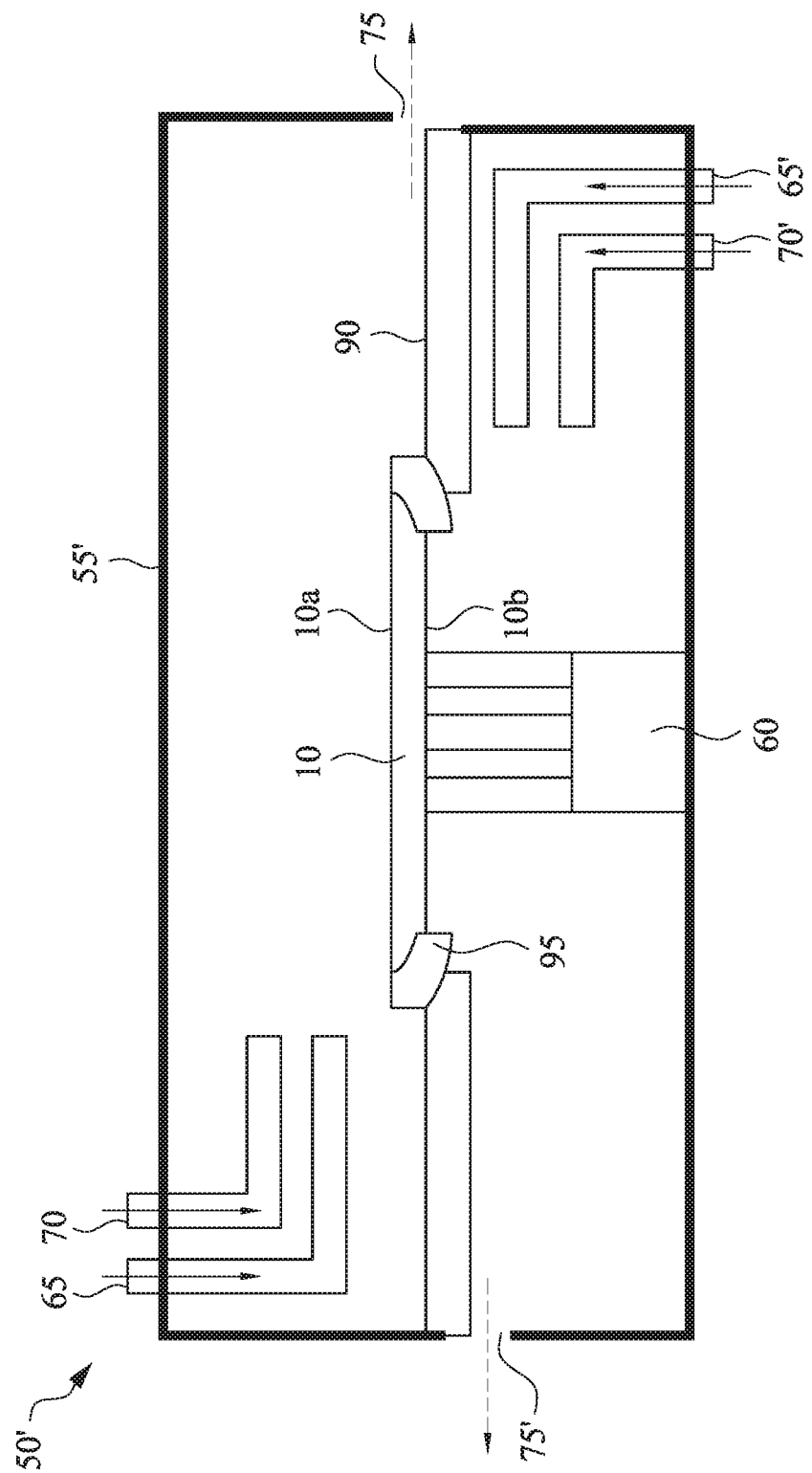
FIG. 5 is a schematic illustration of a deposition chamber according to an embodiment of the present disclosure.

FIG. 5 is a schematic illustration of a deposition chamber according to an embodiment of the present disclosure. In some embodiments, the first main side 10*a* of the semiconductor substrate is exposed to a first portion of the chamber 50' and isolated from a second portion of the chamber 50' by a blocking material 95. The blocking material 95 surrounds a periphery of the semiconductor substrate 10 and contacts a barrier 90, such as a chuck, thereby isolating a first portion of the chamber 50 from a second portion of the chamber 50. In some embodiments, the blocking material blocks the friction-reducing material from passing from one side of the chamber to another side of the chamber. In some embodiments, the blocking material is a gasket or an o-ring. Therefore, in some embodiments, a first main side 10*a* of the semiconductor substrate is exposed to a different ambient than an opposing second main side 10*b* of the semiconductor substrate.

In some embodiments, the semiconductor substrate 10 is introduced into the chamber 50' and is supported on a three-pin substrate support 60. The semiconductor substrate 10 is surrounded by a blocking material 95. The blocking material 95 contacts the semiconductor substrate 10 and a barrier 90 that contacts the walls 55' of the chamber, thereby isolating one portion of the chamber 50' from another portion of the chamber 50'. In some embodiments, the barrier 90 is a chuck.

In some embodiments, the friction-reducing material is introduced into the chamber 50' at a coating material inlet 65, and the friction-reducing material is deposited on semiconductor substrate 10. Excess friction-reducing material is removed from the chamber at an exhaust 75. In some embodiments, the chamber 50' is flushed with an inert gas introduced through a carrier gas inlet 65 prior to or after the friction-reducing material is applied to the semiconductor substrate 10. The inert gas includes nitrogen, helium, neon, argon, and/or xenon.

In some embodiments, the chamber 50', including the chamber walls 55', barrier 90, and blocking material 95, are configured to apply the friction-reducing material to a first main side 10*a* of the semiconductor substrate and prevent the friction-reducing material from being applied to the opposing second main side 10*b* of the semiconductor substrate. In some embodiments, the chamber 50' is configured to allow the first main side 10*a* and the opposing second main side 10*b* of the semiconductor substrate to be independently coated with the friction-reducing material, or to allow both sides to be coated with different materials. As shown in FIG. 5, the portion of the chamber that the second main side 10*b* of the semiconductor substrate is exposed to includes a separate second coating material inlet 65', second carrier gas inlet 70', and second exhaust 75'. In some embodiments, the second coating material inlet 65' is located on an opposing side of the blocking material 95 from the first coating material inlet 65. The portion of the chamber 50' that the first main side 10*a* of the semiconductor substrate is exposed to is isolated from the portion of the chamber 50' that the second main side 10*b* of the semiconductor substrate is exposed to by a combination of the chamber wall 55', barrier 90, and blocking material 95 configuration. Thus, in some embodiments, different ambients are maintained in the different portions of the chamber.

In some embodiments, the chamber 50' includes a heater. The heater may be a localized heater, such as a hot plate, on which the semiconductor substrate is placed or a heater that heats the chamber walls 55', thereby heating the different portions of the chamber or the entire chamber.

Figure 6:
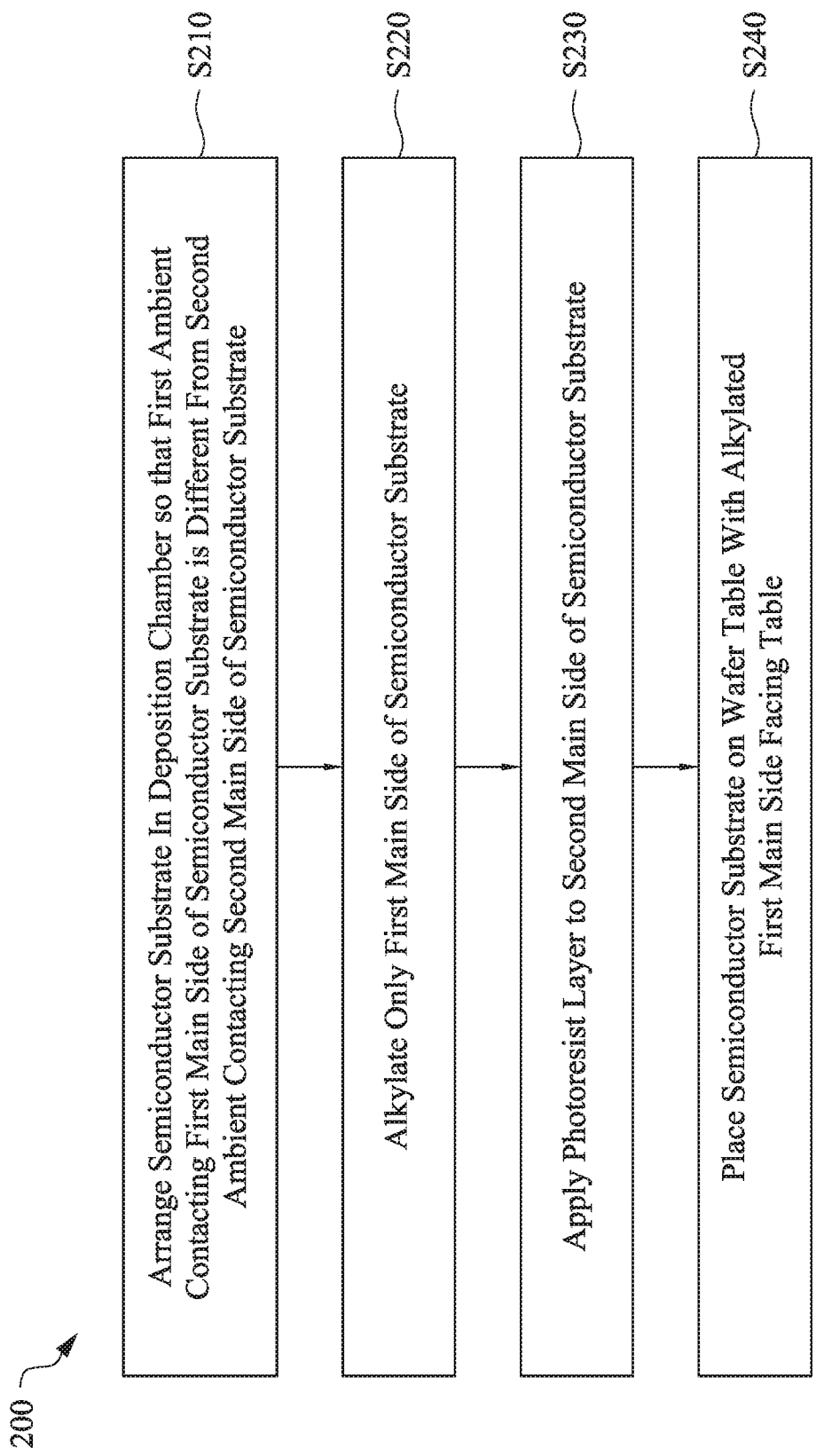
FIG. 6 is a flowchart illustrating a method of treating a semiconductor substrate according to embodiments of the present disclosure.

FIG. 6 is a flowchart illustrating a method 200 of treating a semiconductor substrate according to embodiments of the present disclosure. The method 200 includes an operation S210 of arranging the semiconductor substrate in a deposition chamber so that a first ambient contacting a first main side of the semiconductor substrate is different from a second ambient contacting a second main side of the semiconductor substrate. The second main side opposes the first main side. In operation S220, only the first main side of the semiconductor substrate is alkylated, thereby providing an alkylated first main side of the semiconductor substrate. A photoresist layer is applied to the second main side of the semiconductor substrate in operation S230, and the semiconductor substrate is placed on a wafer table so that the alkylated first main side of the semiconductor substrate faces the table in operation S240. In some embodiments, the method includes additional operations, including selectively exposing the photoresist layer to actinic radiation, and providing gas walls in the deposition chamber to isolate the alkylating material from the second main side of the semiconductor substrate during the alkylating only the first main side of the semiconductor substrate. In other embodiments, the method includes applying a blocking material around the semiconductor substrate to isolate the alkylating material from the second main side of the semiconductor substrate during the alkylating only the first main side of the semiconductor substrate.

Figure 7:
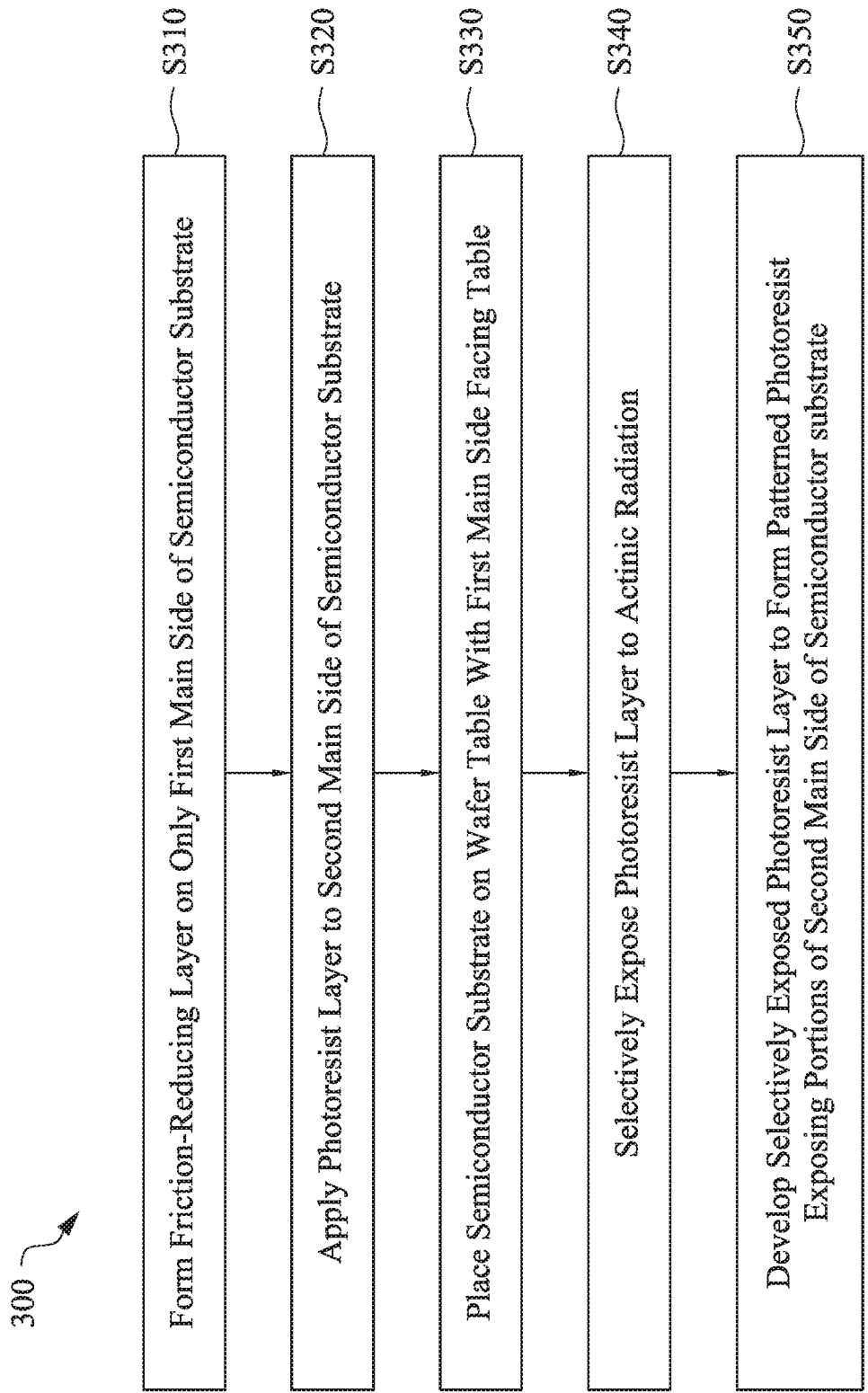
FIG. 7 is a flowchart illustrating a method of manufacturing a semiconductor device according to embodiments of the present disclosure.

FIG. 7 is a flowchart illustrating a method 300 of manufacturing a semiconductor device according to embodiments of the present disclosure. The method includes an operation S310 of forming a friction-reducing layer on only a first main side of a semiconductor substrate. In operation S320, a photoresist layer is applied to a second main side of the semiconductor substrate. The second main side opposes the first main side. The semiconductor substrate is placed on wafer table so that the first main side of the semiconductor substrate faces the table in operation S330. Then the photoresist layer is selectively exposed to actinic radiation in operation S340. The selectively exposed photoresist layer is subsequently developed in operation S350 to form a patterned photoresist exposing portions of the second main side of the semiconductor substrate. In some embodiments, additional operations are performed, including etching the second main side of the semiconductor substrate after the developing operation, and removing the friction-reducing material from the deposition chamber before it can contact the second side of the semiconductor substrate.

Figure 8:
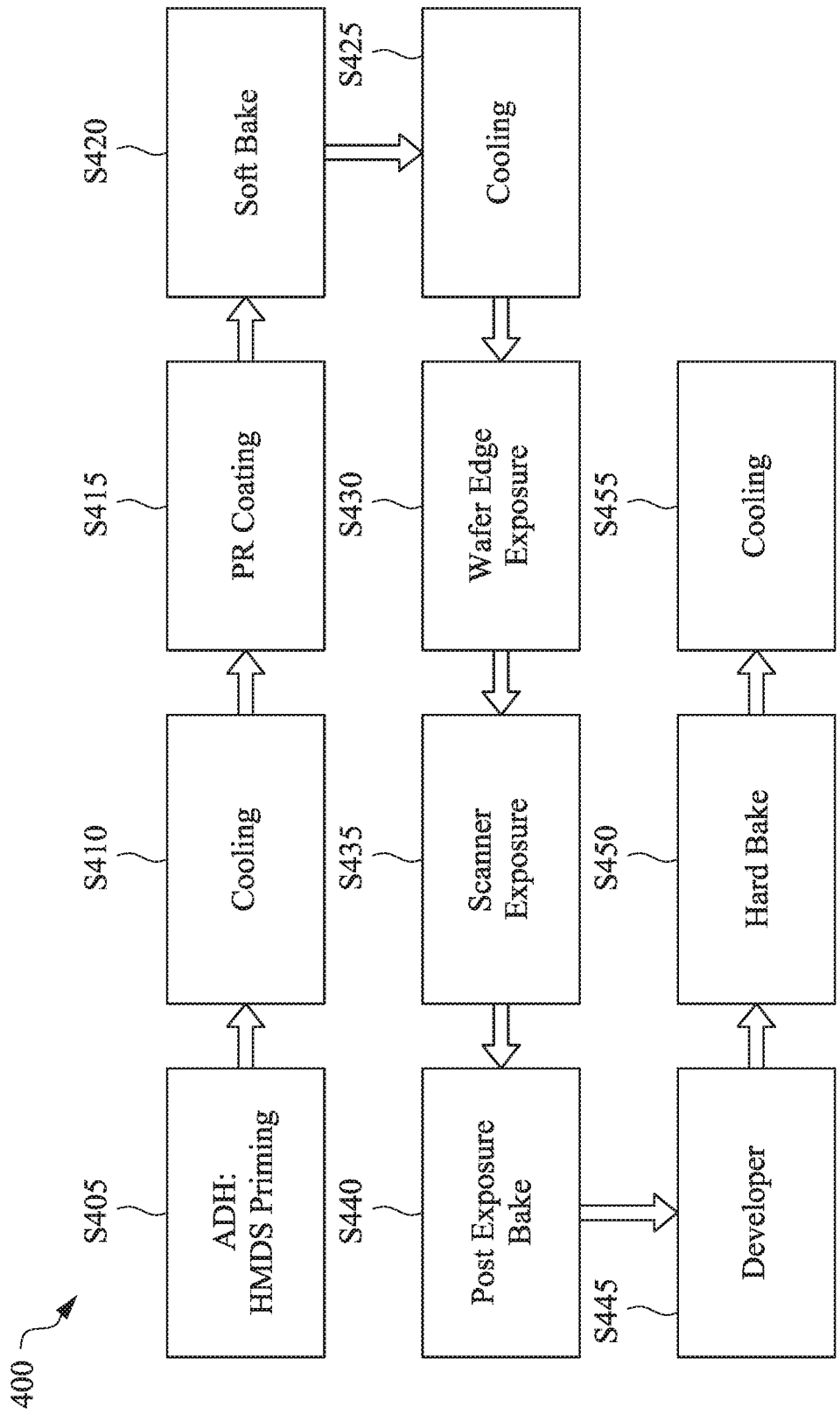
FIG. 8 is a flowchart illustrating a method of manufacturing a semiconductor device according to embodiments of the present disclosure.

Another embodiment of the present disclosure is a method 400 illustrated in the process flow of FIG. 8. The backside of a semiconductor wafer is coated with HMDS in operation S405. In some embodiments, the HMDS coating operation S450 includes a series of vacuum and inert gas flushing operations. For example, in some embodiments, a vacuum is applied to a deposition chamber. In some embodiments, the pressure in the chamber is reduced to about 10 Torr or less for a period of time ranging from about 30 seconds to about 5 minutes. Then, an inert gas, such as nitrogen, is introduced into the deposition chamber raising the pressure to about 760 Torr. The pressure of the inert gas is maintained at about 760 Torr for about 1 minute to about 10 minutes in some embodiments. A vacuum is then applied again to a pressure of about 10 Torr or less for a period of time ranging from about 30 seconds to about 5 minutes, followed by introducing an inert gas to raise the pressure to about 760 Torr. The operations of applying a vacuum and flushing with inert gas are repeated a plurality of times in some embodiments. The applying the vacuum and flushing operations removes moisture and oxygen from the chamber. Prior to introducing the HMDS, a vacuum of about 1 Torr or less is applied for a period of time ranging from about 30 seconds to about 5 minutes. HMDS is subsequently is introduced into the chamber to a pressure of about 2 Torr to about 20 Torr. In some embodiments, the pressure of the HMDS in the chamber is about 5 Torr to about 10 Torr. The HMDS is applied for a duration of time of about 1 minute to about 20 minutes in some embodiments. In some embodiments, the chamber is heated to a temperature of about 125° C. to about 200° C. during the application of the HMDS to the wafer. In some embodiments, the wafer is heated to a temperature of about 125° C. to about 200° C. by placing it on a hotplate during the application of HMDS. The wafer is heated to about 150° C. in some embodiments. After the application of HMDS, the chamber is purged by one more alternating vacuum applications and inert gas flushing operations in some embodiments. When the deposition operations are completed, the chamber is backfilled with inert gas and the wafer can be removed from the chamber.

In some embodiments, the HMDS undergoes an alkylation reaction with the wafer surface in the chamber. For example, when the wafer is a silicon wafer the HMDS reacts with hydroxyl groups on the surface of wafer (Si—OH) and introduces alkyl groups (methyl groups) on the surface of the wafer (Si—O—$CH_3$). The alkylated surface of the wafer has a lower coefficient of static friction relative to a wafer table surface than the non-alkylated surface.

After the application of HMDS, the wafer is cooled in operation S410 and then a photoresist is coated on the main surface of the wafer opposing the HMDS treated surface in operation S415 (wafer front side). In some embodiments, the photoresist is a positive tone photoresist. In other embodiments, the photoresist is a negative tone photoresist. The photoresist-coated wafer is then subjected to a soft bake at a temperature of about 40° C. to about 150° C. in some embodiments for about 10 seconds to about 10 minutes in operation S420 to remove the photoresist solvent, followed by a cooling operation S425. The photoresist-coated wafer is subsequently placed on a wafer scanner table in photolithographic scanner tool in some embodiments. In some embodiments, the wafer edge is subsequently exposed to actinic radiation in operation S430. In some embodiments, the photoresist-coated wafer is selectively exposed to actinic radiation by a scanning actinic radiation source to form a latent pattern in the photoresist layer in operation S435. In some embodiments, the actinic radiation is ultraviolet radiation, deep ultraviolet radiation, extreme ultraviolet radiation, electron beam, or ion beam. The region of the photoresist layer exposed to actinic radiation undergoes a chemical reaction thereby changing its solubility in a subsequently applied developer relative to the region of the photoresist layer not exposed to radiation. In some embodiments, the portion of the photoresist layer exposed to radiation undergoes a crosslinking reaction.

After forming a latent pattern in the photoresist layer by the scanning exposure, the wafer undergoes a post-exposure bake in operation S440. In some embodiments, during the post-exposure bake the photoresist layer is heated to a temperature of about 50° C. and 160° C. for about 20 seconds to about 120 seconds. The post-exposure baking may be used in order to assist in the generating, dispersing, and reacting of the acid/base/free radical generated from the impingement of the actinic radiation upon the photoresist layer during the exposure. Such thermal assistance helps to create or enhance chemical reactions that generate chemical differences between the exposed region and the unexposed region within the photoresist layer. These chemical differences also cause differences in the solubility between the exposed region and the unexposed region.

The selectively exposed photoresist layer is subsequently developed by applying a developer to the selectively exposed photoresist layer in operation S445. In some embodiments, the unexposed region of the photoresist layer is removed by the developer forming a pattern of openings in the photoresist layer to expose a portion of the wafer to be patterned. In operation S450, the developed patterned layer of photoresist undergoes a hard baking to drive off any remaining photoresist or developer solvent. In some embodiments, the hard baking is performed at a temperature of about 40° C. to about 240° C. for a period of time ranging from about 30 seconds to about 10 minutes. Then, the hard-baked wafer with a photoresist pattern formed thereon is cooled in operation S455 prior to undergoing additional semiconductor device manufacturing operations.

In some embodiments, the pattern in the photoresist layer is extended into the wafer. The pattern is extended into the wafer by etching, using one or more suitable etchants. The exposed photoresist layer is at least partially removed during the etching operation in some embodiments. In other embodiments, the exposed photoresist layer is removed after etching the wafer by using a suitable photoresist stripper solvent or by a photoresist ashing operation.

Methods and deposition chambers according to the present disclosure reduces scratches and surface irregularities on a wafer table, thereby providing prolonged wafer table life. In some embodiments, the life of the wafer table is increased from 2 months to 12 months while being used for mass production. In some embodiments, an improved overlay swirl map by backside HMDS coating is provided. In some embodiments, CD variation and scum/residue defects are decreased by implementing the methods and deposition chambers of the present disclosure.

An embodiment of the disclosure is a method of treating a semiconductor substrate, including converting a first main side of the semiconductor substrate having a first coefficient of static friction relative to a surface of a wafer table to a second coefficient of static friction relative to the surface of the wafer table, wherein the second coefficient of static friction is less than the first coefficient of static friction. A photoresist layer is applied over a second main side of the semiconductor substrate having the first coefficient of static friction. The second main side opposes the first main side. The semiconductor substrate is placed on the wafer table so that the first main side of the semiconductor substrate faces the wafer table. In an embodiment, the converting a first main side of the semiconductor substrate includes applying a friction-reducing material to the first main side of the semiconductor substrate. In an embodiment, the friction-reducing material is hexamethyldisilazane (HMDS) or tetramethyl ammonium hydroxide (TMAH). In an embodiment, the friction-reducing material is applied in a deposition chamber configured to allow only the first main side of the semiconductor substrate to be coated with the friction-reducing material. In an embodiment, the friction-reducing material is removed from the deposition chamber before the friction-reducing material can contact the second main side of the semiconductor substrate. In an embodiment, gas walls are used in the deposition chamber to isolate the friction-reducing material to a specific region of the deposition chamber. In an embodiment, a gas in the gas walls is air or an inert gas. In an embodiment, the second main side of the semiconductor substrate is surrounded by a blocking material to prevent the friction-reducing material from contacting the second side of the semiconductor substrate. In an embodiment, the blocking material is a gasket or o-ring.

In another embodiment of the disclosure a method of treating a semiconductor substrate, includes arranging the semiconductor substrate in a deposition chamber so that a first ambient contacting a first main side of the semiconductor substrate is different from a second ambient contacting a second main side of the semiconductor substrate. The second main side opposes the first main side. Only the first main side of the semiconductor substrate is alkylated, thereby providing an alkylated first main side of the semiconductor substrate. A photoresist layer is applied over the second main side of the semiconductor substrate, and the semiconductor substrate is placed on a wafer table so that the alkylated first main side of the semiconductor substrate faces the table. In an embodiment, the method includes selectively exposing the photoresist layer to actinic radiation. In an embodiment, the alkylating material is hexamethyldisilazane (HMDS). In an embodiment, gas walls are used in the deposition chamber to isolate the alkylating material from the second main side of the semiconductor substrate during the alkylating only the first main side of the semiconductor substrate. In an embodiment, a gas in the gas walls is air or an inert gas. In an embodiment, the method includes applying a blocking material around the semiconductor substrate to isolate the alkylating material from the second main side of the semiconductor substrate during the alkylating only the first main side of the semiconductor substrate. In an embodiment, the blocking material is a gasket or o-ring.

In another embodiment of the disclosure, a deposition chamber includes a substrate support, a first coating material inlet, and a first exhaust. The chamber is configured so that material introduced into the chamber through the first coating material inlet only contacts one main side of a semiconductor substrate in the deposition chamber. In an embodiment, the substrate support is a three-pin support. In an embodiment, the chamber includes gas wall gas inlets configured to provide a gas wall surrounding the substrate support, wherein the gas wall is configured so that material introduced into the chamber from the coating material inlet does not pass across the gas wall. In an embodiment, the deposition chamber includes a blocking layer surrounding the semiconductor substrate so that material introduced into the chamber from the coating material inlet does not pass across the blocking layer. In an embodiment, the deposition chamber includes a second coating material inlet located in an opposite side of the chamber from the first coating material inlet. In an embodiment, the gas wall extends from chamber walls to sides of the semiconductor substrate. In an embodiment, the blocking layer is a gasket or an o-ring. In an embodiment, the second coating material inlet is located on an opposing side of the gas wall from the first coating material inlet. In an embodiment, the second coating material inlet is located on an opposing side of the blocking layer from the first coating material inlet. In an embodiment, the deposition chamber includes a passage from the coating material inlet to the substrate support. In an embodiment, the deposition chamber includes a carrier gas inlet.

In another embodiment of the disclosure, a method of manufacturing a semiconductor device includes forming a friction-reducing layer on only a first main side of a semiconductor substrate, and applying a photoresist layer to a second main side of the semiconductor substrate. The second main side opposes the first main side. The semiconductor substrate is placed on a wafer table so that the first main side of the semiconductor substrate faces the table, and the photoresist layer is selectively exposed to actinic radiation. In an embodiment, the method includes developing the selectively exposed photoresist layer to form a patterned photoresist exposing portions of the second main side of the semiconductor substrate. In an embodiment, the method includes etching the second main side of the semiconductor substrate after the developing. In an embodiment, the friction-reducing material is hexamethyldisilazane (HMDS) or tetramethyl ammonium hydroxide (TMAH). In an embodiment, the friction-reducing layer is formed in a deposition chamber configured to allow only the first main side of the semiconductor substrate to be coated with the friction-reducing layer. In an embodiment, the friction-reducing material is removed from the deposition chamber before it can contact the second side of the semiconductor substrate. In an embodiment, gas walls are used in the deposition chamber to isolate the friction-reducing material to a specific region of the deposition chamber. In an embodiment, a gas in the gas walls is air or an inert gas. In an embodiment, the second main side of the semiconductor substrate is surrounded by a blocking material to prevent the friction-reducing material from contacting the second side of the semiconductor substrate. In an embodiment, the blocking material is a gasket or o-ring. In an embodiment, the semiconductor substrate is a semiconductor wafer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of treating a semiconductor substrate, comprising:
   converting a first main side of the semiconductor substrate having a first coefficient of static friction relative to a surface of a wafer table to a second coefficient of static friction relative to the surface of the wafer table,
   wherein the second coefficient of static friction is less than the first coefficient of static friction;
   applying a photoresist layer over a second main side of the semiconductor substrate having the first coefficient of static friction,
   wherein the second main side opposes the first main side; and
   placing the semiconductor substrate on the wafer table so that the first main side of the semiconductor substrate faces the wafer table,
   wherein the converting a first main side of the semiconductor substrate comprises applying a friction-reducing material to the first main side of the semiconductor substrate, and
   the friction-reducing material is hexamethyldisilazane (HMDS) or tetramethyl ammonium hydroxide (TMAH).

2. The method according to claim 1, wherein the friction-reducing material is applied in a deposition chamber configured to allow only the first main side of the semiconductor substrate to be coated with the friction-reducing material.

3. The method according to claim 2, wherein the friction-reducing material is removed from the deposition chamber before the friction-reducing material can contact the second main side of the semiconductor substrate.

4. The method according to claim 2, wherein gas walls are used in the deposition chamber to isolate the friction-reducing material to a specific region of the deposition chamber.

5. The method according to claim 4, wherein a gas in the gas walls is air or an inert gas.

6. The method according to claim 1, wherein the second main side of the semiconductor substrate is surrounded by a blocking material to prevent the friction-reducing material from contacting the second side of the semiconductor substrate.

7. The method according to claim 6, wherein the blocking material is a gasket or o-ring.

8. A method of treating a semiconductor substrate, comprising:
   converting a first main side of the semiconductor substrate having a first coefficient of static friction relative to a surface of a wafer table to a second coefficient of static friction relative to the surface of the wafer table,
   wherein the second coefficient of static friction is less than the first coefficient of static friction;
   applying a photoresist layer over a second main side of the semiconductor substrate having the first coefficient of static friction,
   wherein the second main side opposes the first main side;
   placing the semiconductor substrate on the wafer table so that the first main side of the semiconductor substrate faces the wafer table,
   wherein the semiconductor substrate is arranged in a deposition chamber so that a first ambient contacting the first main side of the semiconductor substrate is different from a second ambient contacting the second main side of the semiconductor substrate; and
   selectively exposing the photoresist layer to actinic radiation.

9. The method according to claim 8, wherein the converting a first main side of the semiconductor substrate comprises applying a friction-reducing material to the first main side of the semiconductor substrate.

10. The method according to claim 9, wherein gas walls are used in the deposition chamber to isolate the friction-reducing material from the second main side of the semiconductor substrate.

11. The method according to claim 10, wherein a gas in the gas walls is air or an inert gas.

12. A method of treating a semiconductor substrate, comprising:
    converting a first main side of the semiconductor substrate having a first coefficient of static friction relative to a surface of a wafer table to a second coefficient of static friction relative to the surface of the wafer table,
    wherein the second coefficient of static friction is less than the first coefficient of static friction;
    applying a photoresist layer over a second main side of the semiconductor substrate having the first coefficient of static friction,
    wherein the second main side opposes the first main side; and
    placing the semiconductor substrate on the wafer table so that the first main side of the semiconductor substrate faces the wafer table,
    wherein converting a first main side of the semiconductor substrate includes alkylating only the first main side of the semiconductor substrate using an alkylating material to provide an alkylated first main side of the semiconductor substrate,
    wherein the alkylating material is hexamethyldisilazane (HMDS).

13. The method according to claim 12, wherein gas walls are used in the deposition chamber to isolate the alkylating material from the second main side of the semiconductor substrate during the alkylating only the first main side of the semiconductor substrate.

14. The method according to claim 13, wherein a gas in the gas walls is air or an inert gas.

15. The method according to claim 12, further comprising applying a blocking material around the semiconductor substrate to isolate the alkylating material from the second main side of the semiconductor substrate during the alkylating only the first main side of the semiconductor substrate.

16. The method according to claim 15, wherein the blocking material is a gasket or o-ring.

17. The method according to claim 8, further comprising cooling the semiconductor substrate after converting the first main side of the semiconductor substrate having a first coefficient of static friction relative to a surface of a wafer table to the second coefficient of static friction relative to the surface of the wafer table and before applying the photoresist layer over the second main side of the semiconductor substrate.

18. The method according to claim 8, further comprising heating the selectively exposed photoresist layer at a temperature of 50° C. to 160° C., and then developing the selectively exposed photoresist layer to form a pattern in the photoresist layer.

19. The method according to claim 12, further comprising selectively exposing the photoresist layer to actinic radiation.

20. The method according to claim 19, further comprising developing the selectively exposed photoresist layer to form a pattern.

* * * * *